(12) United States Patent
Moore et al.

(10) Patent No.: US 10,903,313 B2
(45) Date of Patent: Jan. 26, 2021

(54) APPARATUS FOR CONTROLLING DRIVER CURRENT FOR ILLUMINATION SOURCE

(71) Applicant: STMICROELECTRONICS (RESEARCH & DEVELOPMENT) LIMITED, Marlow (GB)

(72) Inventors: John Kevin Moore, Edinburgh (GB); Caixin Zhuang, Singapore (SG)

(73) Assignee: STMICROELECTRONICS (RESEARCH & DEVELOPMENT) LIMITED, Marlow (GB)

( * ) Notice: Subject to any disclaimer, the term of this patent is extended or adjusted under 35 U.S.C. 154(b) by 251 days.

(21) Appl. No.: 15/638,834

(22) Filed: Jun. 30, 2017

(65) Prior Publication Data

US 2018/0102407 A1  Apr. 12, 2018

(30) Foreign Application Priority Data

Oct. 12, 2016  (EP) ..................................... 16193532

(51) Int. Cl.
*G01S 17/10* (2020.01)
*G01S 7/497* (2006.01)
*H05B 45/00* (2020.01)
*H05B 47/18* (2020.01)
*G01S 7/4863* (2020.01)
(Continued)

(52) U.S. Cl.
CPC ........ *H01L 29/0642* (2013.01); *G01S 7/4863* (2013.01); *G01S 7/497* (2013.01); *G01S 17/10* (2013.01); *G09G 3/3216* (2013.01); *G09G 3/3283* (2013.01); *H01L 31/02027* (2013.01); *H01L 31/107* (2013.01); *H05B 45/00* (2020.01); *H05B 47/18* (2020.01)

(58) Field of Classification Search
None
See application file for complete search history.

(56) References Cited

U.S. PATENT DOCUMENTS

2014/0231631 A1* 8/2014 Moore .................... G01S 17/10
                                                                  250/214.1
2015/0041625 A1   2/2015 Dutton et al.
(Continued)

FOREIGN PATENT DOCUMENTS

CN   102027388 A   4/2011
CN   206989974 U   2/2018

*Primary Examiner* — Lynda Jasmin
*Assistant Examiner* — Laura Yesildag
(74) *Attorney, Agent, or Firm* — Slater Matsil, LLP

(57) ABSTRACT

A single photon avalanche diode based range detecting apparatus includes a reference array of single photon avalanche diodes configured to receive light from an illumination source via an internally coupled path. A return array of single photon avalanche diodes is configured to receive light from the illumination source via an external free space path. A calibration pulse generator is configured to generate a calibration signal pulse. Readout circuitry is configured to receive an output of the reference array via a reference signal path, an output of the return array via a return signal path, and an output of the calibration pulse generator via a calibration signal path. The readout circuitry is configured to determine a delay difference value between the reference signal path and the return signal path based on the output of the calibration pulse generator via the calibration signal path.

25 Claims, 7 Drawing Sheets

(51) Int. Cl.
G09G 3/3216 (2016.01)
G09G 3/3283 (2016.01)
H01L 29/06 (2006.01)
H01L 31/02 (2006.01)
H01L 31/107 (2006.01)

(56) References Cited

U.S. PATENT DOCUMENTS

2016/0047904 A1* 2/2016 Mellot .................... G01S 17/10
356/5.03
2016/0291316 A1   10/2016 Mellot et al.

* cited by examiner

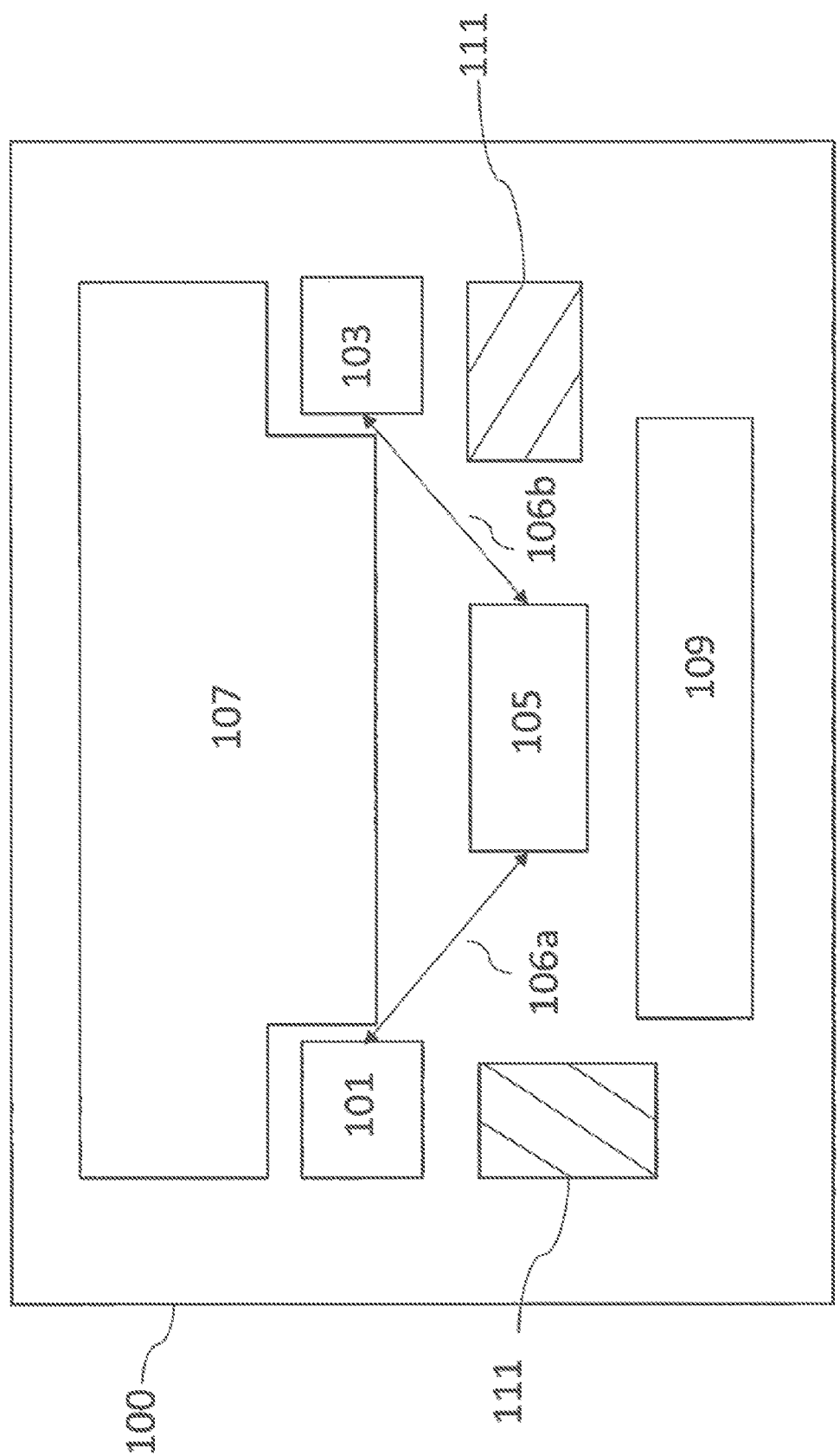

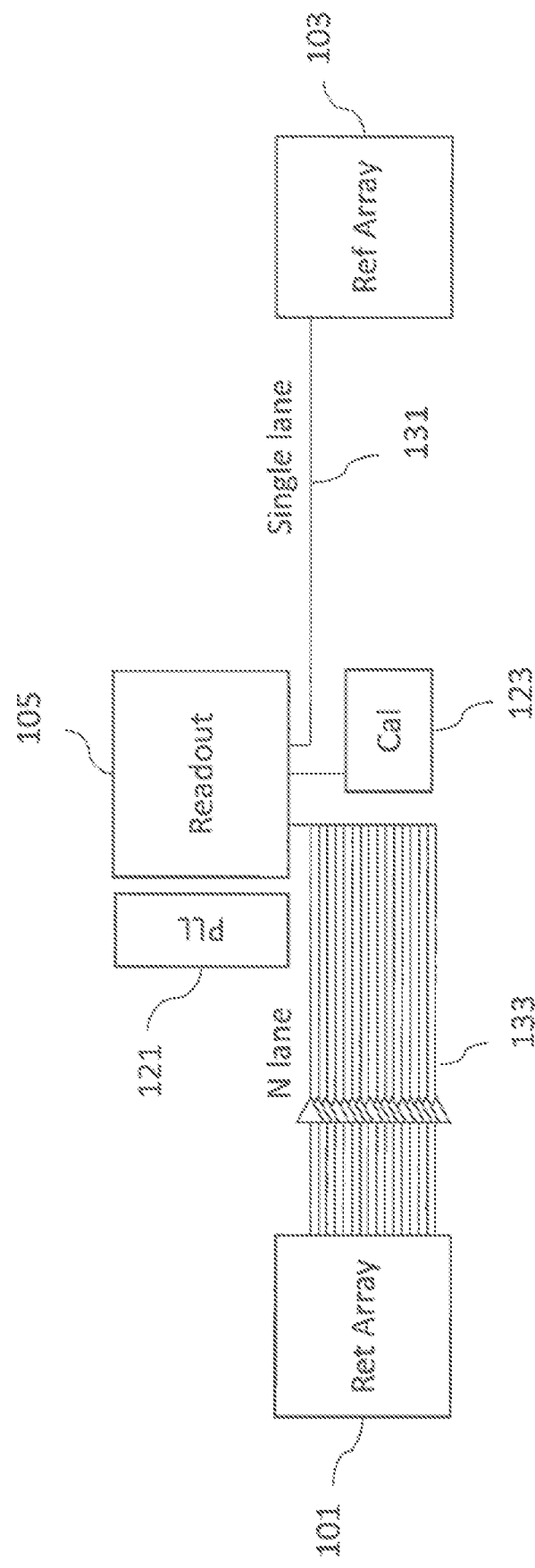

APPARATUS FOR CONTROLLING DRIVER CURRENT FOR ILLUMINATION SOURCE

CROSS-REFERENCE TO RELATED APPLICATIONS

This application claims priority to European Patent Application No. 16193532.5, filed on Oct. 12, 2016, which application is hereby incorporated herein by reference.

TECHNICAL FIELD

Some embodiments relate to an apparatus and in particular but not exclusively to an apparatus with an array of photosensitive devices.

BACKGROUND

Single photon avalanche diode (SPAD) Time of Flight (ToF) sensors typically comprise arrays of single photon avalanche diodes and an illumination source in the form of a vertical cavity surface emitting laser (VCSEL). The vertical cavity surface emitting laser is provided with current by a driver circuit which is typically configured to be able to control the current through the laser in order to produce a pulse or other waveform outputs.

The physical layout of a typical SPAD sensor is a complex problem to solve. It requires locating various components on the substrate at various locations over an area and coupling these components in a suitable manner in order to attempt to optimize a set of measured parameters, such as performance related parameters. However these arrangements and configurations may not be optimal with respect to the measured parameters for many reasons such as they would typically cause a significant deterioration in the cost of the device or quality of the output because of some other constraint issue.

Conventional arrangements and configurations typically attempt to optimize the layout of the SPAD sensor in such a way that couplings or pathways between the reference array and readout circuitry and return arrays and readout circuitry are the same in order to prevent or significantly reduce any timing differences between the signals generated by the reference signal path and the return signal path. However such arrangements produce non-optimal arrangements with respect to layout utilization and often produce arrangements where significant areas cannot be used.

SUMMARY

According to a first aspect, a single photon avalanche diode based range detecting apparatus comprises a reference array of single photon avalanche diodes configured to receive light from an illumination source via an internally coupled path. A return array of single photon avalanche diodes is configured to receive light from the illumination source via an external free space path. A calibration pulse generator is configured to generate a calibration signal pulse. Readout circuitry is configured to receive an output of the reference array via a reference signal path; an output of the return array via a return signal path and an output of the calibration pulse generator via a calibration signal path. The calibration signal path comprises a first signal path substantially following the reference signal path. The readout circuitry is configured to determine a delay difference value between the reference signal path and the return signal path based on the output of the calibration pulse generator via the calibration signal path.

The first signal path may be arranged from the calibration pulse generator to the readout circuitry via the reference array, the calibration signal path may further comprise a second signal path coupled to the readout circuitry, and the readout circuitry configured to determine the delay difference being may be further configured to: receive the calibration signal pulse via the first signal path; receive the calibration signal pulse via the second signal path; determine a timing difference between the calibration pulses received via the first and the second signal path; and determine the delay difference value as a half of the timing difference.

The calibration pulse generator may be configured to generate a modulated delayed signal, wherein the modulated delayed signal has a dynamic range greater than a quantization step of the readout circuitry.

The readout circuitry may be configured to compensate for any difference between the reference signal path and the return signal path by applying the delay difference value.

The readout circuitry may be configured to compensate for any difference between the reference signal path and the return signal path by delaying the output of the return array by the delay difference value.

The configuration of the reference array of single photon avalanche diodes, the return array of single photon avalanche diodes, and the readout circuitry may be such that a combination of reference signal path routing area and return signal path routing area is optimized.

The configuration of the reference array of single photon avalanche diodes, the return array of single photon avalanche diodes, and the readout circuitry may be such that the utilization of the area of the apparatus is optimized.

The illumination source may comprises one of a vertical cavity surface emitting laser and a light emitting diode.

According to a second aspect, a method for operating a single photon avalanche diode based range detecting apparatus is disclosed. A reference array of single photon avalanche diodes is configured to receive light from a illumination source via an internally coupled path and a return array of single photon avalanche diodes is configured to receive light from the illumination source via an external free space path. A calibration pulse generator is configured to generate a calibration signal pulse. Readout circuitry receives an output of the reference array via a reference signal path and an output of the return array via a return signal path. The readout circuitry receives an output of the calibration pulse generator via a calibration signal path. The calibration signal path comprises a first signal path substantially following the reference signal path. A delay difference value is determined, at the readout circuitry, between the reference signal path and the return signal path based on the output of the calibration pulse generator via the calibration signal path.

The method may further comprise providing the first signal path arranged from the calibration pulse generator to the readout circuitry via the reference array; and providing a second signal path for the calibration signal path coupled to the readout circuitry, wherein determining the delay difference may further comprise: receiving the calibration signal pulse via the first signal path; receiving the calibration signal pulse via the second signal path; determining a timing difference between the calibration pulses received via the first and the second signal path; and determining the delay difference value as a half of the timing difference.

The method may further comprise generating a modulated delayed signal, wherein the modulated delayed signal has a dynamic range greater than a quantization step of the readout circuitry.

The method may further comprise applying the delay difference value to compensate for any difference between the reference signal path and the return signal path.

Applying the delay difference value to compensate for any difference between the reference signal path and the return signal path may comprise delaying the output of the return array by the delay difference value.

The method may further comprise optimizing a configuration of the reference array of single photon avalanche diodes, the return array of single photon avalanche diodes, and the readout circuitry such that a combination of reference signal path routing area and return signal path routing area is optimized.

The method may further comprise optimizing the configuration of the reference array of single photon avalanche diodes, the return array of single photon avalanche diodes, and the readout circuitry such that the utilization of the area of the apparatus is optimized.

BRIEF DESCRIPTION OF THE DRAWINGS

Some embodiments will now be described by way of example only and with reference to the accompanying Figures in which:

FIGS. 1A and 1B show schematic views of known example SPAD sensor arrangements;

DETAILED DESCRIPTION OF ILLUSTRATIVE EMBODIMENTS

Figure 2:
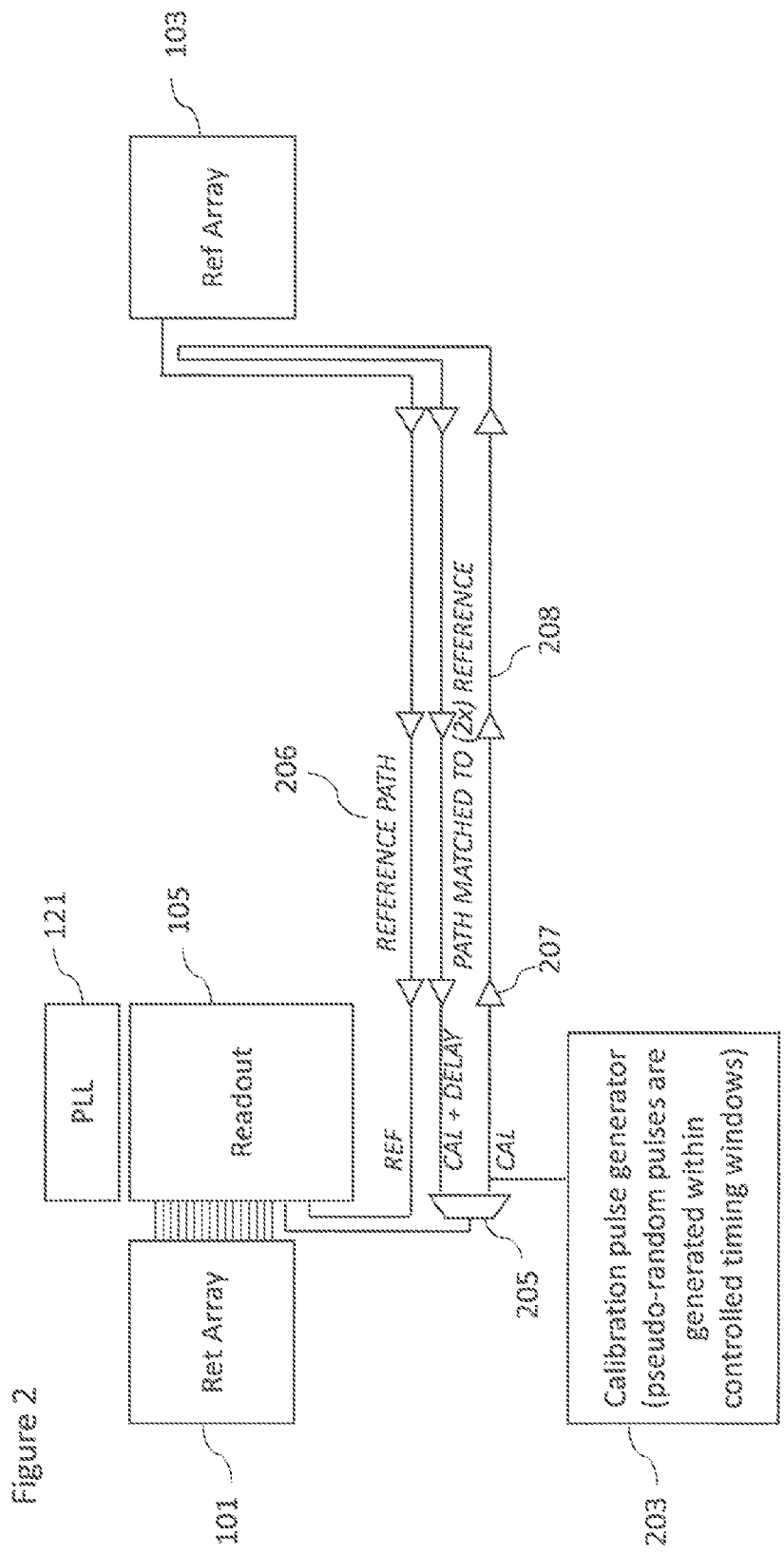
FIG. 2 shows a schematic view of an example SPAD sensor arrangement according to some embodiments.

The concept as employed herein is to implement and calibrate a SPAD ToF sensor with asymmetrical signal paths from the return and reference arrays. This is implemented as described in further detail hereafter by minimizing the path distance between the return array and the readout circuitry and providing a signal path matched to the reference array signal path or a multiple of the reference array signal path such that the difference between the return array signal path and the reference array signal path may be determined and enable calibration of the difference to be applied to the return signal path so to minimize the effect of the difference.

The physical layout of a single photon avalanche diode (SPAD) sensor module is a complex problem to solve. FIG. 1A shows an overview of a known example SPAD sensor 100 arrangement. The SPAD sensor 100 comprises a reference array 103 of single photon avalanche diodes which is typically located on a first side or edge of the sensor (and is typically located close to the vertical cavity surface emitting laser (VCSEL) not shown in FIG. 1A. Although in the following examples the VCSEL is shown as an illumination source for the sensor, any other suitable illumination source (e.g., LED) may be implemented. The reference array is configured with an internal optical path between the VCSEL and the array and is furthermore shaded such that photons external to the sensor are blocked. The reference array thus may be used to enable the cancellation of delays in the system (digital→VCSEL driver→optical output→SPAD output→OR tree out).

The SPAD sensor 100 may furthermore comprise a return array 101 of SPADs and is typically located on the opposite side of the sensor to the reference array 103. The return array 101 is configured to receive reflected photons from objects illuminated by the VCSEL and thus may be associated with lensing or other optical elements (not shown) for focusing the light onto the return array. Typically an optical barrier (not shown) is located between the reference and return arrays to block the parasitic or internal path from the VCSEL.

The SPAD sensor 100 may further comprise digital circuitry 107 such as the timing and control electronics, analog circuitry 109, and readout circuitry 105. In the following examples the readout circuitry 105 is shown implemented with digital circuitry, it may in some embodiments be implemented with analog circuitry.

The readout circuitry 105 is configured to receive the output signals from the return array 101 and the reference array 103 and as such is typically located as close to the center of the floor plan or structure such that the signal pathways are matched in order to match routing delays between the arrays 101, 103 and the readout circuitry 105.

For example, as shown in FIG. 1A readout circuitry 105 is located approximately half way between the return array 101 and the reference array 103. Thus the distance (or routing distance) 106a between the return array 101 and the readout circuitry 105 and the distance (or routing distance) 106b between the readout circuitry 105 and the reference array is approximately equal.

This arrangement with approximately equal distances (or matched) allows the reference path time delay and return array time delay, where the signal from the reference and return array is received by the readout circuitry 105 respectively, is approximately equal and delay variations produced by changes in supply voltage and/or operating temperature variations are matched.

Such implementations, however, require a layout which is constrained by a forced analog circuitry-digital circuitry split which in turn results in an underutilization of the available area. This is shown, for example, in FIG. 1A by the areas marked in.

Furthermore, such implementations introduce significant routing channel issues especially where the return array is configured to output not only one output but separate sub-array outputs. Thus where the return array 101 has N outputs the routing channel is significant in size.

An example of this is shown in FIG. 1B. FIG. 1B shows the equal length routing example comprising the return array 101, reference array 103 which are coupled to the readout circuitry 105 and the associated circuitry such as the clock generating phase locked loop circuitry 121 and the calibration circuitry 123.

In this example the routing from the reference array 101 to the readout circuitry 105 is a single lane 131 but the routing from the return array 101 to the readout circuitry 105 is N lanes 133.

There is thus, as discussed earlier a significant motivation for rearranging or configuring the floor plan (or layout) of the sensor to reduce the overall routing layout requirement and furthermore enable an asymmetric arrangement which would enable a greater utilization of the available area of the sensor.

The concept as discussed herein in further detail is to configure the arrangement of the components on the sensor such that the readout circuitry 105 is located close to the return array 101 in order to reduce the routing resources required. However the consequence of reduction of the routing distance is to make the reference path time delay and return array time delay unmatched.

The solution to this lack of matching is to enable a calibration of the readout circuitry and thus calibration of the reference path time delay and return array time delay by providing a signal path which approximately follows or matches the reference array signal path between the reference array and the readout circuitry 105. This calibration signal path may be configured to receive a calibration pulse, a pseudo random pulse, which enables the difference in signal paths to be determined and allowed for. In some embodiments the calibration signal path may be a whole integer multiple, for example twice, the distance between the reference array to readout circuitry 105.

This calibration result may then be applied to compensate for the determined signal path difference. For example, the reference measurement results may have a calibration delay subtracted (or in practice the return array signal delayed by the difference).

With respect to FIG. 2 an example apparatus according to some embodiments is described in further detail. The sensor shown in FIG. 2 is exemplary only and it is understood that the component arrangement in some sensors may differ from the location of the components shown. The sensor arrangement shown in FIG. 2 shows the return array 101 being located close to the readout circuitry 105 such that the routing lanes between the return array and readout circuitry 105 are significantly shorter than the routing lanes shown in FIG. 1B.

Furthermore the PLL circuitry 121 are shown arranged such that it is possible to configure the layout such that the other area is better utilized about the readout circuitry 105.

The reference array 103, which is located at approximately the same location away from the return array 101 as shown in FIG. 1B, has a routing or reference signal path 206. The routing or reference signal path 206 may be longer than the reference signal path shown in the matched distance path example shown in FIG. 1B but the combined routing paths of the return and the reference arrays are significantly less because of the reduction of the N return array routing paths against the increase of the one reference array routing path.

In some embodiments the reference path 206 may comprise one or more inverters in order to reduce any capacitive or inductive coupling.

The example sensor shown in FIG. 2 may further comprise a calibration pulse generator 203. The calibration pulse generator may be configured to introduce a pulse signal on a calibration signal path 208 that includes buffer 207.

In the sensor configuration shown in FIG. 2 the calibration signal path comprises a first branch which is a first input to a multiplexer 205 and a second branch which is a path which approximately follows the reference signal path to the reference array and then back to form a second input to the multiplexer 205.

The multiplexer 205 may be configured to select and output one of the two branch inputs to the readout circuitry 105.

Although the example shown in FIG. 2 shows the split branch arrangement calibration signal path two separate calibration paths may be employed (one from the calibration pulse generator 203 to the readout circuitry 105 and another from the calibration pulse generator 203 to the reference array 103 following the reference signal path 206 and then from the reference array 103 to the readout circuitry 105 following the signal path.

Figure 3:
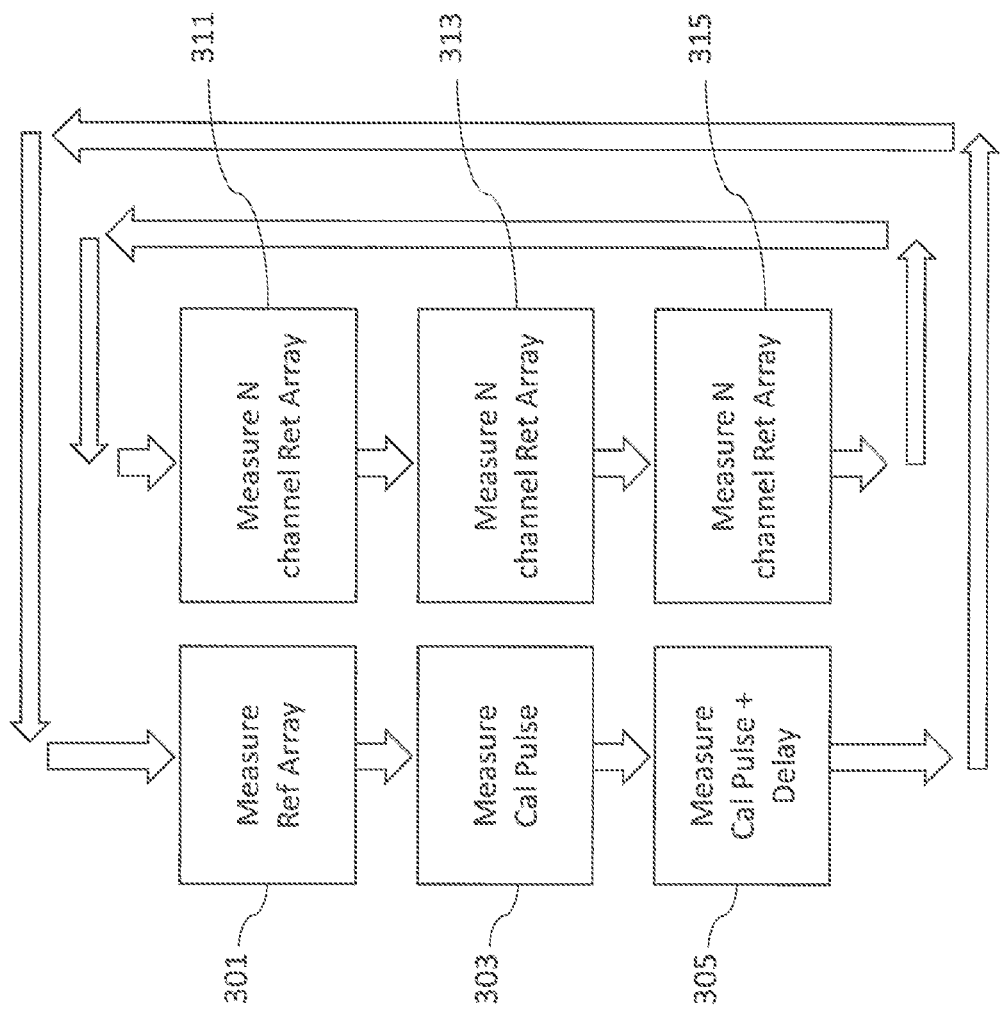
FIG. 3 shows a flow diagram showing the parallel operation of return and reference array with additional delay calibration operations according to some embodiments.

FIG. 3 shows a flow diagram of a method implemented by the sensor shown in FIG. 2. The operations as described herein are for a parallel operation of measurement from the reference array and measurements from the return array. In the example shown in FIG. 3 there is a first flow pathway which shows the operations of measuring the output from the N channels from the return array. This is shown as a sequence of separate measurements.

A first operation of measuring the output from the N channels from the return array is shown in FIG. 3 by step 311.

Then a second operation of measuring the output from the N channels from the return array is shown in FIG. 3 by step 313.

Furthermore a third operation of measuring the output from the N channels from the return array is shown in FIG. 3 by step 315.

In the example shown in FIG. 3 the sequence may then return to the first measurement in other words looping back to step 311. However the number of measurements of the return array may be any suitable number (for example, 20) before restarting the sequence.

In parallel with the operations of measuring the output from the N channels from the return array may be performed a series of reference array measurements and calibration/calibration with delay measurements.

Thus as shown in FIG. 3 there is a second flow pathway or set of operations concerning the reference measurement and calibration and delay measurements.

In parallel with the first operation of measuring the output from the N channels from the return array may therefore be the operation of measuring the output from the reference array. This is shown in FIG. 3 by step 301.

In parallel with the second operation of measuring the output from the N channels from the return array may therefore be the operation of measuring a calibration pulse from the calibration pulse generator to the readout circuitry 105. This is shown in FIG. 3 by step 303.

In parallel with the third operation of measuring the output from the N channels from the return array may therefore be the operation of measuring a calibration pulse from the calibration pulse generator to the readout circuitry 105 which passes along the calibration path (or branch) which is matched with the reference signal path. The readout circuit may then be able to determine the delay introduced by the calibration path (or branch) which is matched with the reference signal path and thus determine the delay introduced by the reference signal path. This may be determined, for example, by dividing the difference between the calibration and calibration and delay path time by 2. This is shown in FIG. 3 by step 305. The determined reference signal path delay may then be applied to the reference measurement (or in other words the return array measurement delayed by this amount) in order to compensate for the difference between the reference routing signal path and the return array routing signal path.

Figure 4:
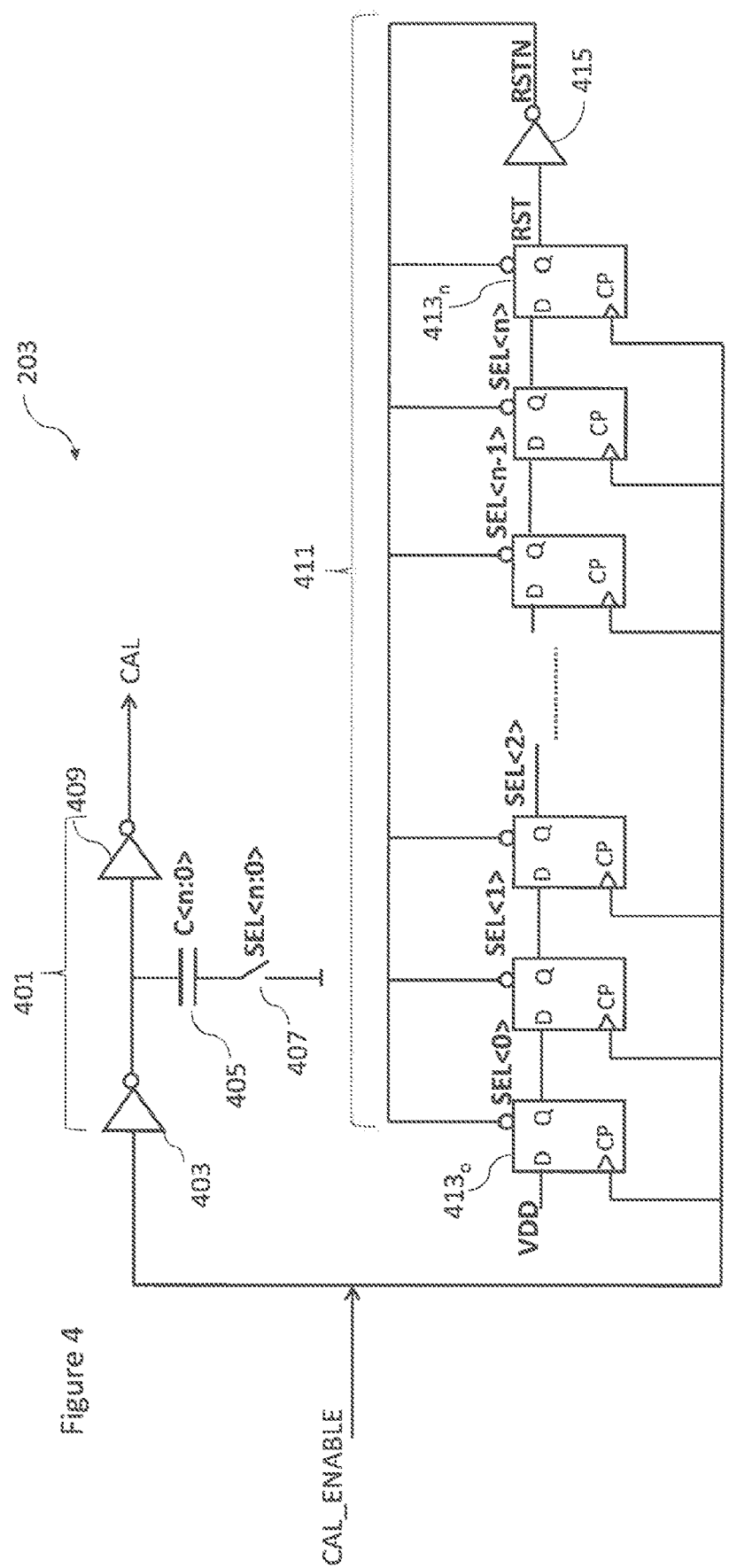
FIG. 4 shows a schematic view of a first calibration pulse generator circuit according to some embodiments.
Figure 5:
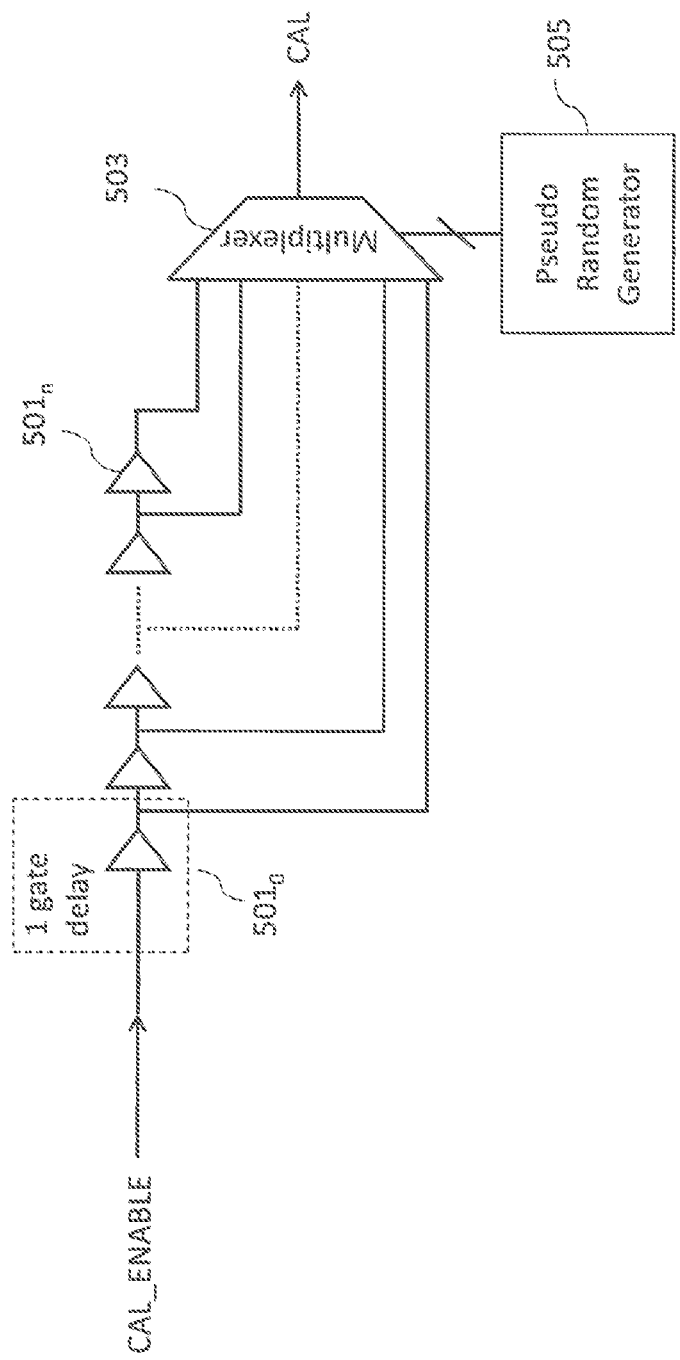
FIG. 5 shows a schematic view of a first calibration pulse generator circuit according to some embodiments.

With respect to FIGS. 4 and 5 example pulse generators are shown. Such pulse generators are required for a quantized readout implementation, such as a Time to Digital Converter (TDC) to temporally spread the position of the rising edge of pulses passed to the readout in calibration mode. In some embodiments the implementation of the concepts described herein may be implemented within a continuous readout system. For example, the embodiments may be implemented within an ADLL based scheme. In such embodiments it may not be necessary for the rising edge of a calibration pulse to be dithered. FIG. 4 shows a first example of a pulse generator 203 such as shown in FIG. 2 and suitable for generating pulses to be output on the calibration path matched with the reference signal path. The calibration pulse generator 203 comprises a calibration enable input which initializes the pulse generator 203 and which is passed to a controllable delay line 401. The controllable delay line 401 comprises a first inverter 403. The first inverter is configured to output to a series of delay elements. Each delay element comprising a capacitor 405 and series switch 407 which can be selectively coupled between the output of the first inverter 403 and ground. The delay may therefore be selected from a minimum value where all of the capacitors are not coupled to a maximum value where all of the capacitors are coupled. The series switch 407 for each delay element may be controlled by the outputs of a shift register 411. The delay dynamic range is typically greater than one quantization step of the readout system. The delay line further comprises a second inverter 409 with an input coupled to the output of the first inverter 403 and an output configured to generate the calibration pulse signal.

The pulse generator 203 may furthermore comprise a shift register 411 comprising a series of daisy chained latches $413_0$ to $413_n$. The first latch $413_0$ input is a VDD voltage and the last latch $413_n$ output is coupled to the reset input for all of the latches. Furthermore the latches are clocked by the calibration enable signal such that the shift registers generate an output pattern which increments the number of capacitors by one each time the calibration enable signal is enabled. In other words the output of the latches generate a repeated pattern of . . . 0001, . . . 0011, . . . 0111, . . . 1111.

With respect to FIG. 5 a further example of a pulse generator is shown. In the pulse generator shown in FIG. 5 there is a series of chained gate delay elements $501_0$ to $501_n$, the first of which is configured to receive the calibration enable signal. Each delay element is further configured to be output to a multiplexer 503. The multiplexer 503 is further configured to receive as a selection input the output of a pseudo random number generator 505. The multiplexer is thus configured to output as the calibration pulse signal the delayed calibration enable signal.

In some embodiments the pseudo random generator 505 may be replaced by a pattern generator or by a linear number generator.

Figure 6:
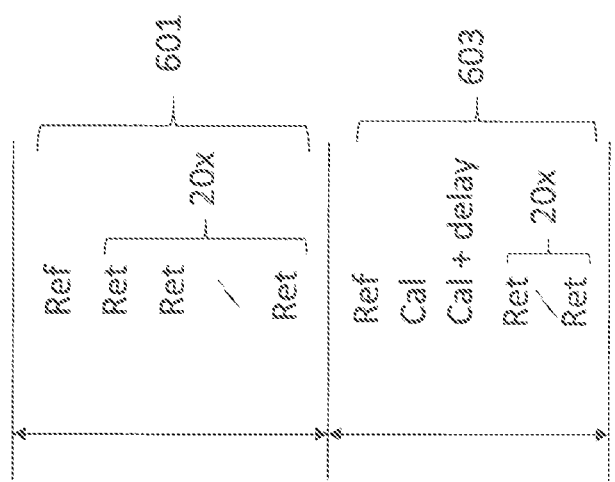
FIG. 6 shows a flow diagram showing the serial operation of calibration operations according to some embodiments.

Although the example shown in FIG. 3 shows a reference and calibration series of operation and a return array series of operations being performed in parallel it is understood that in some embodiments non-parallel operations may be performed. For example, FIG. 6 shows a series process. In this example a first cycle 601 of operations includes the measurement from the reference array (Ref) followed by a number (for example, 20) of measurements from the return array (Ret). Following the first cycle 601 a further cycle 603 is shown which includes the measurement from the reference array (Ref) followed by a calibration (Cal) and delayed calibration (Cal+delay) measurement is performed which is in turn further followed by a number (for example, 20) of measurements from the return array (Ret).

It should be appreciated that the above described arrangements may be implemented at least partially by an integrated circuit, a chip set, one or more dies packaged together or in different packages, discrete circuitry or any combination of these options.

Various embodiments with different variations have been described here above. It should be noted that those skilled in the art may combine various elements of these various embodiments and variations.

Such alterations, modifications, and improvements are intended to be part of this disclosure, and are intended to be within the scope of the present invention. Accordingly, the foregoing description is by way of example only and is not intended to be limiting. The present invention is limited only as defined in the following claims and the equivalents thereto.

What is claimed is:

1. A single photon avalanche diode based range detecting apparatus comprising:
    a reference array of single photon avalanche diodes configured to receive light from a illumination source via an internally coupled path;
    a return array of single photon avalanche diodes configured to receive light from the illumination source via an external path different than the internally coupled path;
    a calibration pulse generator configured to generate a calibration signal pulse; and
    readout circuitry configured to receive:
        an output of the reference array via a reference signal path;
        an output of the return array via a return signal path; and
        an output of the calibration pulse generator via a calibration signal path, the calibration signal path comprising a first signal path substantially following the reference signal path, wherein the first signal path is different from the reference signal path, and wherein the readout circuitry is configured to determine a delay difference value between the reference signal path and the return signal path based on the output of the calibration pulse generator via the calibration signal path, wherein the calibration signal path is longer than the reference signal path.

2. The apparatus as claimed in claim 1, wherein the first signal path is arranged from the calibration pulse generator to the readout circuitry via the reference array, wherein the calibration signal path further comprises a second signal path coupled to the readout circuitry, and wherein the readout circuitry configured to determine the delay difference value is further configured to:
    receive the calibration signal pulse via the first signal path;
    receive the calibration signal pulse via the second signal path;
    determine a timing difference between the calibration signal pulses received via the first and the second signal path; and
    determine the delay difference value as a half of the timing difference.

3. The apparatus as claimed in claim 1, wherein the calibration pulse generator is configured to generate a modulated delayed signal that has a dynamic range greater than a quantization step of the readout circuitry.

4. The apparatus as claimed in claim 1, wherein the readout circuitry is configured to compensate for any difference between the reference signal path and the return signal path by applying the delay difference value.

5. The apparatus as claimed in claim 4, wherein the readout circuitry is configured to compensate for any difference between the reference signal path and the return signal path by delaying the output of the return array by the delay difference value.

6. The apparatus as claimed in claim 1, wherein the illumination source comprises a vertical cavity surface emitting laser or a light emitting diode.

7. A single photon avalanche diode based range detecting apparatus comprising:
   a reference array of single photon avalanche diodes configured to receive light from a illumination source via an internally coupled path;
   a return array of single photon avalanche diodes configured to receive light from the illumination source via an external path different than the internally coupled path;
   a calibration pulse generator configured to generate a calibration signal pulse;
   readout circuitry configured to determine a delay difference value based on signals from the reference array and the return array;
   a reference signal path coupled between the reference array and the readout circuitry;
   a return signal path coupled between the return array and the readout circuitry; and
   a calibration signal path coupled between the calibration pulse generator and the readout circuitry, the calibration signal path comprising a first signal path substantially following the reference signal path, wherein the first signal path is different from the reference signal path, and wherein the calibration signal path is longer than the reference signal path.

8. The apparatus as claimed in claim 7, wherein the first signal path is arranged from the calibration pulse generator to the readout circuitry via the reference array, wherein the calibration signal path further comprises a second signal path coupled to the readout circuitry.

9. The apparatus as claimed in claim 8, wherein the readout circuitry configured to determine the delay difference value based on a timing difference between calibration signal pulses received via the first and the second signal path.

10. The apparatus as claimed in claim 7, wherein the calibration pulse generator is configured to generate a modulated delayed signal that has a dynamic range greater than a time quantization step of the readout circuitry.

11. A device comprising:
    a readout circuit;
    a reference array coupled to the readout circuit via a reference signal path and configured to receive light from an illumination source via an internally coupled path;
    a return array coupled to the readout circuit via a return signal path and configured to receive light from the illumination source via an external path different than the internally coupled path; and
    a calibration pulse generator coupled to the readout circuit via a calibration signal path, the calibration pulse generator configured to generate a calibration signal pulse via the calibration signal path, wherein the readout circuit is configured to determine a delay difference value between the reference signal path and the return signal path based on the calibration signal pulse, wherein the calibration signal path comprises a first signal path that substantially follows the reference signal path, wherein the first signal path is different from the reference signal path, and the calibration signal path being longer than the reference signal path.

12. The device of claim 11, further comprising a multiplexer, wherein the first signal path is arranged from the calibration pulse generator to the readout circuit via the multiplexer.

13. The device of claim 12, wherein the calibration signal path comprises a second signal path coupled to the readout circuit via the multiplexer.

14. The device of claim 13, wherein the readout circuit is configured to determine the delay difference value by:
    receiving the calibration signal pulse via the first signal path;
    receiving the calibration signal pulse via the second signal path;
    determining a timing difference between the calibration signal pulses received via the first and the second signal path; and
    determining the delay difference value as a half of the timing difference.

15. The device of claim 11, wherein the calibration pulse generator is configured to generate a modulated delayed signal that has a dynamic range greater than a time quantization step of the readout circuit.

16. The device of claim 11, wherein the return signal path is shorter than the reference signal path.

17. The device of claim 11, wherein the return array is located closer to the readout circuit than the reference array.

18. The device of claim 11, further comprising the illumination source coupled to the reference array via an internal path, wherein the illumination source is a vertical cavity surface emitting laser.

19. The device of claim 11, wherein the readout circuit is configured to compensate for a difference between the reference signal path and the return signal path by delaying an output of the return array by the delay difference value.

20. The device of claim 11, wherein the calibration pulse generator comprises a controllable delay line and a shift register coupled to the controllable delay line.

21. The device of claim 12, wherein the calibration pulse generator comprises a second multiplexer having an output coupled to the readout circuit, and a pseudo-random generator configured to control the second multiplexer.

22. The apparatus as claimed in claim 1, wherein the first signal path comprises a buffer.

23. The apparatus as claimed in claim 1, wherein the first signal path is coupled to a first input of a multiplexer, and to a second input of the multiplexer.

24. The apparatus as claimed in claim 1, wherein the return signal path is shorter than the reference signal path.

25. The apparatus as claimed in claim 1, wherein the return array and the reference array are asymmetrically located with respect to the readout circuitry.

* * * * *